FREQUENCY MODULATOR FOR WIDE DEVIATIONS

Filed Jan. 29, 1959

INVENTOR.
P. S. BENGSTON

BY [signature]
ATTORNEYS.

2,984,793
Patented May 16, 1961

2,984,793

FREQUENCY MODULATOR FOR WIDE DEVIATIONS

Phillip S. Bengston, Takoma Park, Md., assignor to the United States of America as represented by the Secretary of the Navy Filed Jan. 29, 1959, Ser. No. 790,027

3 Claims. (Cl. 332—14)

(Granted under Title 35, U.S. Code (1952), sec. 266)

The invention described herein may be manufactured and used by or for the Government of the United States of America for governmental purposes without the payment of any royalties thereon or therefor.

This invention relates to a frequency modulator and more particularly to a frequency modulator having a saw tooth generator and a step function modulation input voltage.

The modulator described in accordance with this invention was designed for use with magnetic tape recorders. The tapes were to be recorded to saturation, therefore a non-sinusoidal output from the modulator would be satisfactory. The modulator had to possess linear characteristics over a wide range of frequencies and the response time to a step function input had to be immediate. Furthermore the circuit had to be as sensitive as possible consistent with good stability. Another requirement of the modulator was that the sensitivity had to be easily adjustable.

Previous modulators were less sensitive and the response time was much slower. In a previously available modulator the frequency would change immediately to about 85 percent of its final value when a step function input was applied. The final frequency was reached only after a slow drift. Further, the sensitivity and the frequency stability were relatively low in prior art devices.

With the present invention a modulator has been produced which will provide a response to a step voltage input function which is clean and sharp with no delayed rise or over shoot. The sensitivity was found to be from 30 to 50 times greater than that of previous devices and the frequency deviation was found to be linear to about 1 percent in the frequency range from 25 to 75 kilocycles. The transition from the base frequency to a higher frequency was accomplished within the time required for one cycle of the base frequency.

The present device uses a blocking-oscillator-type saw tooth generator in which a capacitor has a charge path through the cathode circuit of a discharge path through a pair of series cascade connected triode vacuum tubes.

An object of this invention is to provide a frequency modulator with a step function input voltage.

Another object of this invention is to provide apparatus for producing a frequency modulated saw tooth voltage.

Another object of this invention is to provide means for changing the frequency of a saw tooth voltage by instantaneously changing the discharge rate of a capacitor.

Another object of this invention is to provide a frequency modulator suitable for tape recording instrumentation.

A further object of this invention is to provide a frequency modulator capable of withstanding an acceleration of thirty times that of gravity.

A further object of this invention is to provide a frequency modulator having a blocking oscillator with a step input modulation voltage.

A still further object of this invention is to provide a frequency modulator which is linear over a wide range of frequencies.

Other objects and many of the attendant advantages of this invention will be readily appreciated as the same becomes better understood by reference to the following detailed description when considered in connection with the accompanying drawing wherein.

Figure 1:
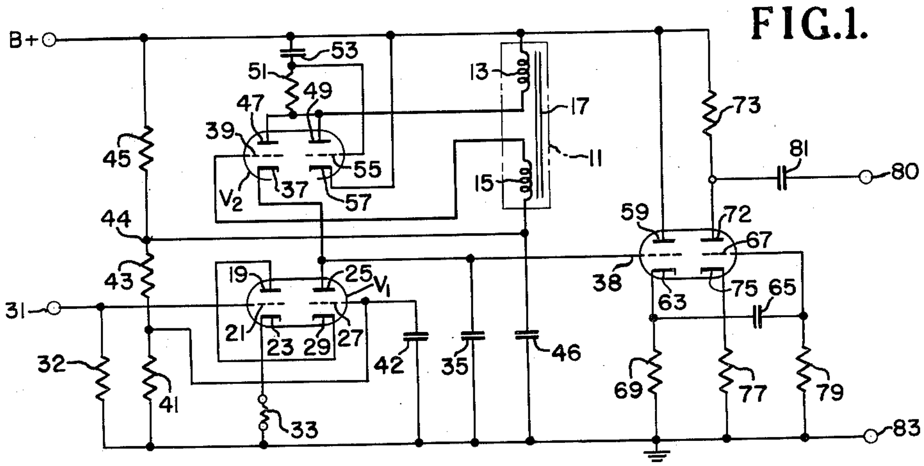
Fig. 1 illustrates a schematic diagram of the modulator circuit.

Referring to Fig. 1 of the drawings in which the frequency modulator is illustrated, an oscillator portion includes electron tubes V1 and V2 and pulse transformer 11 having windings 13 and 15 on a common iron core 17. Tube V1 is illustrated as a dual triode, an example of which is a 12AX7 type tube. Tube V2 is illustrated as a dual triode, an example of which is the 5687 type tube. The transformer 11 is an iron core transformer designed for pulse operation. A first triode section of tube V1 comprises plate 19, grid 21 and cathode 23. A second triode section of tube V1 comprises plate 25, grid 27 and cathode 29. Plate 19 of the first triode section of V1 connects directly to cathode 29 of the second triode section of tube V1. Grid 21 connects to signal input terminal 31. Resistor 32 connects between grid 31 and ground. Resistor 32 may have a value of 1.8 megohms. Cathode 23 connects through gain setting resistor 33 to ground. Gain setting resistor 33 may range in size from about 500 ohms to about 50,000 ohms depending upon the gain desired. In the exemplary embodiment a resistor having a value of 1000 ohms may be used. In the second triode section of V1, capacitor 35 connects between the plate and ground. In the exemplary embodiment capacitor 35 may have a value of 330 mmf. Plate 25 is also connected directly to cathode 37 of the first triode section of V2 and to grid 38 of tube V3.

In the second triode section of V1, grid 27 connects to a tap 40 on a voltage divider composed of resistors 41, 43 and 45 serially interconnected between B+ and ground. The resistance values of resistors 41, 43 and 45 may be 5600 ohms, 6800 ohms and 6800 ohms respectively. A capacitor 42 connects between grid 27 and ground. The value of capacitor 42 may be .047 mf.

In the first triode section of V2, grid 39 connects through winding 15 of pulse transformer 11 to tap 44 of the voltage divider. A capacitor 46 connects between tap 44 and ground. Capacitor 46 may have a value of .047 mf. Plate 47 connects directly to plate 49 of the second triode section of V2 and through winding 13 of pulse transformer 11 to B+. A resistor 51 and a capacitor 53 are serially interconnected between the common plate connection of V2 and B+. In the preferred embodiment resistor 51 has a value of 2200 ohms and capacitor 53 has a value of 47 mmf. Grid 55 connects to a juncture betwen resistor 51 and capacitor 53. Cathode 57 connects directly to B+.

The second section of V2 is effectively a diode as thus connected. The diode type connection of the second section of V2 is provided to dampen flyback ring.

An amplifier portion of the modulator includes electron tube V3 which has two triode sections. In the first triode section of V3, plate 59 connects directly to B+. Grid 38 connects to plate 25 of V2 and also to capacitor 35. Cathode 63 connects through capacitor 65 to grid 67 of second triode section of V3 and also through resistor 69 to ground. In the exemplary embodiment resistor 69 may have a value of 5600 ohms. The first triode section of V3 as thus connected acts as a cathode follower with the output of V3 being conducted to the grid of the second triode section of V3 through the cathode circuit. Plate 72 of the second triode section of V3 connects through resistor 73 to B+. Resistor 73 may have a value of 4000 ohms. Cathode 75 connects to ground through resistor 77. Resistor 77 may have a value of 560 ohms. A resistor 79 connects between 67 and ground. Resistor 79 may have a value of 150,000 ohms. Output terminal 80 connects through capacitor 81 to plate 72 and output terminal 83 connects to ground. Capacitor 81 in the exemplary embodiment may have a value of .01 mf.

The frequency of the modulator is determined by the charge and discharge rates of capacitor 35. Consider the instant in time when capacitor 35 is fully discharged or when capacitor 35 begins to charge. The charging path is from ground through capacitor 35 through the first triode section of tube V2 and then through winding 13 of pulse transformer 11 to B+. As current begins to flow through this charging path, a voltage is developed across winding 13 as a result of the current flow in the charging path. The voltage developed in winding 13 sets up an induced voltage in winding 15 which applies a positive voltage to grid 39. The positive voltage applied to grid 39 causes an increase in current flow through the charging circuit. This increase in current causes an additional voltage increase in winding 13 which increases the induced voltage in winding 15 which causes a more positive voltage to be applied on grid 39. The increased positive voltage on grid 39 causes a further increase in the current through the charging path. This recycling continues until the charge on capacitor 35 raises the voltage on cathode 23 to a level where the current flow is reduced and the reduction of current flow in winding 13 sets up a voltage which further induces a voltage in winding 15 in the opposite direction and a negative voltage is applied to grid 39 which completely cuts off the current flow through the first triode section of V2 and through the charging path. The actual peak voltage of capacitor 35 and the charge time are dependent upon the characteristics of the pulse transformer and the transconductance of the charging tube.

As soon as the first triode section of V2 is cut off capacitor 35 begins to discharge. The discharge path for capacitor 35 includes both triode sections of V1 and gain resistor 33. The current flow through the discharge path is from ground through gain setting resistor 33, through the first triode section of V1 then through the second triode section of V1 and through capacitor 35 to ground. The rate of discharge is constant and may be varied by charging the modulator input voltage to grid 21 of the first triode section of V1 or by changing the size of the gain setting resistor 33. In practice, the capacitor 35 is first selected for the frequency range desired. The discharge rate and hence the frequency is varied by changing the modulator input voltage applied to grid 21. Capactior 35 will continue to discharge until the voltage at cathode 37 drops below cut-off for V2 at which time the charging cycle is re-initiated.

Figure 2:
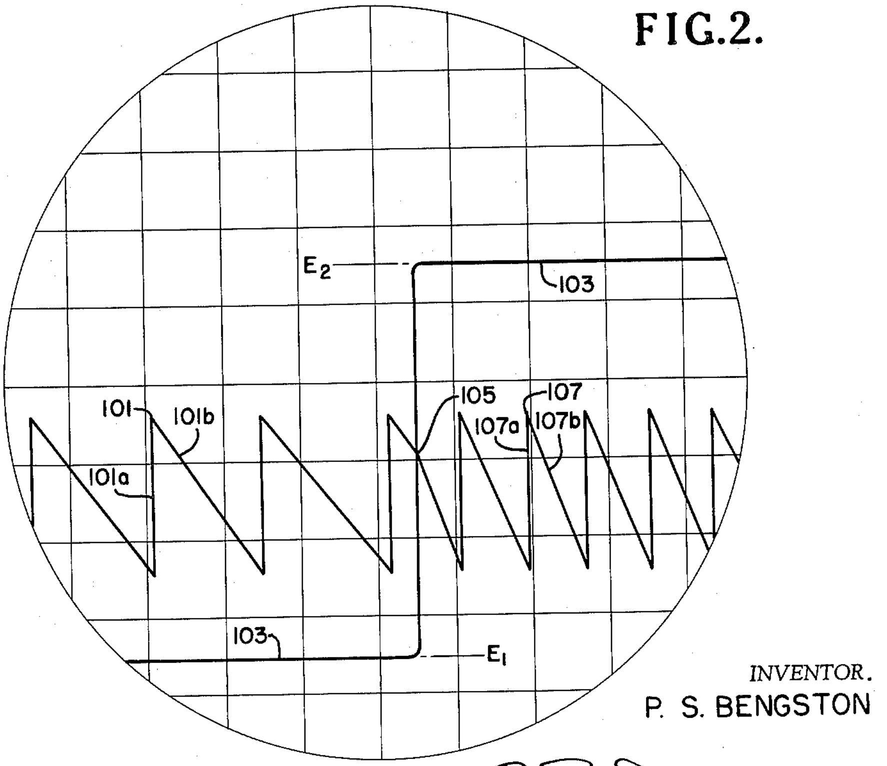
Fig. 2 illustrates an oscillogram display of the effect of a step function input voltage on the output voltage of the modulator.

Referring now to Fig. 2 of the drawing in which an oscillograph is illustrated, the output voltage 101 is shown on grid 103 of the oscillograph. The charging portion of the curve is 101*a* and the discharging portion is 101*b*. The input voltage is shown as a step function in which the potential level is varied from E1 to E2 instantaneously. When the modulator input potential 103 is instantaneously increased from E1 to E2 the discharge rate at point 105 illustrates the immediate change in the discharge rate of capacitor 105. The change in frequency is effected within one cycle and the new frequency of the output voltage is indicated by curve 107 with a charging portion 107*a* and a discharging 107*b*. It is to be noted that only the slope of the discharge portion of the curve is changed. The slope of the charge portion of the curve remains the same. The charging portion 101*a* of curve 101 appears vertical, however, there is a time lapse for charging the capacitor which may be in the order of one microsecond.

Although the tubes V1, V2 and V3 are illustrated as dual triodes, single triodes or other tubes or transistors may be used without departing from the spirit of this invention.

Obviously many modifications and variations of the present invention are possible in the light of the above teachings. It is therefore to be understood that within the scope of the appended claims the invention may be practiced otherwise than specifically described.

What is claimed as new and desired to be secured by Letters Patent of the United States is:

1. A frequency modulator comprising, a first triode having a cathode, a grid, and a plate, a pulse transformer having only two windings, said windings being inductively coupled, means connecting the first of said windings between the plate of said first triode and a source of B+ voltage, a voltage divider, means connecting the second of said windings between said voltage divider and the grid of said first triode, a frequency determining capacitor having a first and a second terminal, means connecting the first terminal to the cathode of said first triode, means connecting the second terminal to a ground potential whereby a charging path for said capacitor through said first triode and through said first winding to a source of positive voltage is provided, a second triode having a cathode, a grid and a plate, a third triode having a cathode, a grid and a plate, a gain setting resistor, means serially connecting said gain setting resistor between the cathode of said second triode and a ground connection means interconnecting the plate of said second triode to the cathode of said third triode, means connecting said plate of said third cathode to the first terminal of said capacitor such that a discharge path for said capacitor is provided, and means applying a variable voltage level to the grid of said second triode such that the rate of capacitor discharge may be varied to vary the modulator output frequency.

2. A frequency modulator comprising a frequency determining capacitor having a first terminal and a second terminal, a charge path for said capacitor, a discharge path for said capacitor, a sawtooth modulator output voltage comprising alternate charge and discharge voltage excursions of said capacitor, a source of positive voltage, a ground potential, a first triode having a cathode, a grid and a plate, a pulse transformer having only two windings, said windings being inductively coupled, said charge path comprising the serial interconnection of the first of said windings, said first triode and said capacitor between said positive voltage and said ground potential, a voltage divider comprising three resistors serially connected between said source of positive voltage and said ground potential, means connecting the second of said windings between said voltage divider and the grid of said first triode, a second and a third triode each having a plate, a grid and a cathode, means connecting said second and third triodes in series-cascade relationship, a gain setting resistor, said discharge path comprising the serial interconnection of said gain setting resistor, said second and third triodes between said ground potential and said second terminal of said capacitor, means connecting a variable modulation voltage level to the grid of said second triode whereby the discharge rate of said capacitor and the frequency of said sawtooth modulator output voltage will be varied.

3. A frequency modulator comprising a frequency determining capacitor having a first terminal and a second terminal, a charge path for said capacitor, a discharge path for said capacitor, a sawtooth modulator output voltage comprising alternate charge and discharge voltage excursions of said capacitor, a source of positive voltage, a ground potential, a first triode having a cathode, a grid, and a plate, a pulse transformer having only two windings, said windings being inductively coupled, means connecting said first terminal of said capacitor to said ground potential, said charge path comprising the serial interconnection of the first of said windings and said first triode between said positive voltage and said second terminal of said capacitor, a source of bias voltage, means interconnecting the second of said windings between the grid of said first triode and said source of bias voltage whereby the current flow in said triode will be influenced, a second and a third triodes, each having a plate, a grid and a cathode, means connecting said second and third triodes in series cascade relationship, a gain setting resistor, said discharge path comprising the serial interconnection of said gain setting resistor and said series-cascade-connected second and third triodes between said ground potential and said second terminal of said capacitor respectively, means connecting a variable modulation voltage level to the grid of said second triode whereby the discharge rate of said capacitor and the frequency of said sawtooth modulator output voltage will be varied.

References Cited in the file of this patent

UNITED STATES PATENTS

| | | |
|---|---|---|
| 2,564,687 | Guenther | Aug. 21, 1951 |